(12) United States Patent
Gokita et al.

(10) Patent No.: US 7,498,784 B2
(45) Date of Patent: Mar. 3, 2009

(54) AVERAGE CURRENT DETECTOR CIRCUIT

(75) Inventors: Takeo Gokita, Tokyo (JP); Takakazu Imai, Tokyo (JP)

(73) Assignee: TDK Corporation, Tokyo (JP)

( * ) Notice: Subject to any disclaimer, the term of this patent is extended or adjusted under 35 U.S.C. 154(b) by 254 days.

(21) Appl. No.: 11/460,201

(22) Filed: Jul. 26, 2006

(65) Prior Publication Data

US 2007/0025048 A1 Feb. 1, 2007

(30) Foreign Application Priority Data

Jul. 26, 2005 (JP) ............................. 2005-215662

(51) Int. Cl.
*G05F 1/40* (2006.01)
(52) U.S. Cl. .................................... 323/282
(58) Field of Classification Search ................ 323/282, 323/283, 284, 285, 288, 351
See application file for complete search history.

(56) References Cited

U.S. PATENT DOCUMENTS

| 6,043,636 A * | 3/2000 | Gaudreau et al. ......... 323/282 |
| 6,127,814 A * | 10/2000 | Goder ....................... 323/282 |
| 7,148,667 B2 * | 12/2006 | Umemoto et al. .......... 323/282 |
| 7,161,332 B1 * | 1/2007 | Kleine et al. ............... 323/222 |
| 7,352,160 B2 * | 4/2008 | Shimizu et al. ............ 323/282 |
| 2008/0088288 A1 * | 4/2008 | Luerkens ................... 323/282 |

FOREIGN PATENT DOCUMENTS

| JP | 10-042569 | 2/1998 |
| JP | 2003-111485 | 4/2003 |
| JP | 2005-198370 | 7/2005 |

* cited by examiner

*Primary Examiner*—Adolf Berhane
(74) *Attorney, Agent, or Firm*—Baker & McKenzie LLP (57) ABSTRACT

A current flowing through a measuring target coil increases when a pulse signal is high. A voltage corresponding to instantaneous value of the current through the coil is input to input terminal. A blanking signal generator circuit generates signal which has predetermined pulse width and rises in synchronization with rise of the pulse signal. During period in which this signal is high, first switch becomes ON and first capacitor holds the voltage at the input terminal. A second switch becomes ON when first switch becomes OFF to connect second capacitor to connection node between resistors, and disconnects second capacitor from connection node when the pulse signal becomes low. Second capacitor is charged with voltage corresponding to average value of an amount of increase in the current through the coil. A voltage obtained by adding the voltage charged in first capacitor to this charged voltage is supplied to third capacitor.

8 Claims, 5 Drawing Sheets

AVERAGE CURRENT DETECTOR CIRCUIT

BACKGROUND OF THE INVENTION

1. Field of the Invention

The present invention relates to an average current detector circuit.

2. Description of the Related Art

A switching power supply device, which switches on/off its switching element in response to a control pulse to flow a current intermittently through a coil, is known. This kind of device obtains the average value of the current flowing through the coil in order to have control over the on/off of its switching element. For example, Unexamined Japanese Patent Application KOKAI Publication No. 2003-111485 discloses a sample/hold circuit which obtains the average current across a coil by sampling a voltage corresponding to the current flowing through the coil, synchronously at the center point of a control pulse.

However, it is difficult to locate the center point of a control pulse in real-time. Particularly, in case of PWM (Pulse Width Modulation) control, etc., since the width of a control pulse changes constantly, it is hard to spot the center point of the control pulse accurately. The sample/hold circuit fails to obtain the average current accurately. As a result, the sample/hold circuit cannot control the voltage to be output therefrom accurately.

SUMMARY OF THE INVENTION

The present invention is made in view of the above-described circumstance, and an object of the present invention is to provide an average current detector circuit which can obtain the average value of a current flowing through a coil accurately.

Another object of the present invention is to provide a power supply circuit which can control output current accurately.

To achieve the above objects, an average current detector circuit according to a first aspect of the present invention obtains an average value of a current flowing through a coil during a period in which a pulse, which repetitively becomes ON (active) and OFF (inactive), is being ON, and comprises:

an instantaneous value detector circuit which outputs a detection signal having a signal level corresponding to an instantaneous value of the current flowing through the coil;

a first hold circuit which holds (maintains) the signal level of the detection signal output from the instantaneous value detector circuit at a timing at which the pulse becomes ON;

a ½ circuit which outputs a signal having a signal level corresponding to a sum of ½ of a difference between the signal level held in the first hold circuit and the signal level of the detection signal output from the instantaneous value detector circuit and the signal level held in the first hold circuit; and a second hold circuit which holds the signal level of the signal output from the ½ circuit at a timing at which the pulse becomes OFF, and outputs the held signal level as a signal level corresponding to an average value of the current flowing through the coil, during a period in which the pulse is becoming ON.

The ½ circuit may comprise:

a circuit which obtains and outputs ½ of the difference between the signal level held in the first hold circuit and the signal level of the detection signal output from the instantaneous value detector circuit;

a second hold circuit which holds the signal level output from the ½ circuit at a timing at which the pulse becomes OFF; and a circuit which adds the signal level held in the first hold circuit and the signal level held in the second hold circuit.

The first hold circuit may, in response to the pulse, enter a sampling state when the pulse becomes OFF, and enter a hold state when the pulse becomes ON, and the second hold circuit may, in response to the pulse, enter a sampling state when the pulse becomes ON, and enter a hold state when the pulse becomes OFF.

The instantaneous value detector circuit may comprise a voltage generation circuit which generates a voltage signal having a voltage value corresponding to an instantaneous value of a current flowing through the coil, the first hold circuit may comprise a first sample/hold circuit which samples a voltage generated by the voltage generation circuit at a timing at which the pulse becomes ON, and holds the voltage, and the ½ circuit and the second hold circuit may comprise:

a first voltage dividing circuit which generates a first partial voltage obtained by dividing a difference voltage between the voltage held in the first sample/hold circuit and the voltage generated by the voltage generation circuit into ½ thereof;

a second sample/hold circuit which holds the first partial voltage output from the first voltage dividing circuit at a timing at which the pulse becomes OFF; and a circuit which adds the voltage held in the first sample/hold circuit to the voltage held in the second sample/hold circuit, and outputs a resultant voltage.

The average current detector circuit may further comprise a third sample/hold circuit which shifts to a sampling state after the second sample/hold circuit shifts to a hold state, and shifts to a hold state at a timing at which the first sample/hold circuit shifts to a sampling state.

The average current detector circuit may further comprise a third hold circuit which holds and outputs a signal level of a signal output from the second hold circuit.

The average current detector circuit may further comprise:

a first circuit which supplies a current to the coil from a terminal to which a predetermined voltage is applied, in response to the pulse becoming ON; and a second circuit which switches the first circuit OFF in response to the pulse becoming OFF, and switches the first circuit ON in order to circulate the current that flows through the coil.

The average current detector circuit may further comprise a duty ratio control circuit which controls a duty ratio of the pulse to decrease as the average current increases, and controls the duty ratio of the pulse to increase as the average current decreases.

The average current detector circuit may comprise a duty ratio control circuit which controls a duty ratio of the pulse.

The average current detector circuit may comprise:

a section which detects a failure of pulsation of the pulse; and a reset section which makes a signal level corresponding to the average current ineffective, when a failure of pulsation of the pulse is detected.

To achieve the above objects, an average current detection method according to a second aspect of the present invention obtains an average value of a current flowing through a coil during a period in which a pulse, which repetitively becomes ON and OFF, is being ON, and comprises:

obtaining and holding a current level of a current flowing through the coil at a timing the pulse becomes ON;

continually obtaining ½ of a difference between the held current level and an instantaneous level of the current flowing through the coil, during a period in which the pulse is being ON;

outputting a current level that corresponds to a sum of the held current level and ½ of the difference obtained at a timing at which the pulse becomes OFF, as an average current of the current that flows through the coil during the period in which the pulse is being ON.

To achieve the above objects, an average current detector circuit according to a third aspect of the present invention comprises:

a pulse generation circuit which outputs a pulse which repeats being ON and being OFF;

a coil;

a switching circuit which is connected to one end of the coil, and in response to a pulse from the pulse generation circuit, supplies a current to the coil when the pulse is being ON and circulates a current by energy stored in the coil when the pulse is being OFF;

a capacitor circuit whose one end is connected to the other end of the coil and to an output terminal of a power supply circuit in which the average current detector circuit is included, and whose other end has a reference voltage applied;

a first hold circuit which holds a current level of the current flowing through the coil, in response to the pulse becoming ON;

a ½ circuit which continually obtains ½ of a difference between the current level held in the first hold circuit and an instantaneous level of the current flowing through the coil; and a detector circuit which supplies the pulse generation circuit with a current level which corresponds to a sum of the current level held in the first hold circuit and ½ of the difference output from the ½ circuit in response to the pulse, wherein the pulse generation circuit controls a duty ratio of the pulse in accordance with an average current detected by the detector circuit.

To achieve the above object, an average current detector circuit according to a fourth aspect of the present invention obtains an average value of a current flowing through a coil during a period in which a pulse, which repetitively becomes ON and OFF, is being ON, and comprises:

a hold circuit which obtains and holds a current level of a current flowing through the coil at a timing at which the pulse becomes ON;

a ½ circuit which continually obtains ½ of a difference between the current level held in the hold circuit and an instantaneous level of the current flowing through the coil, during a period in which the pulse is being ON; and a circuit which outputs, at a timing at which the pulse becomes OFF, a current level that corresponds to a sum of the current level held in the hold circuit and ½ of the difference obtained by the ½ circuit, as an average current of the current that flows through the coil during the period in which the pulse is being ON.

According to the present invention, it is possible to easily and appropriately obtain a voltage corresponding to the average value of a current flowing through a coil.

BRIEF DESCRIPTION OF THE DRAWINGS

These objects and other objects and advantages of the present invention will become more apparent upon reading of the following detailed description and the accompanying drawings in which.

DETAILED DESCRIPTION OF THE PREFERRED EMBODIMENT

An embodiment of the present invention will be specifically explained below with reference to the drawings.

Figure 1:
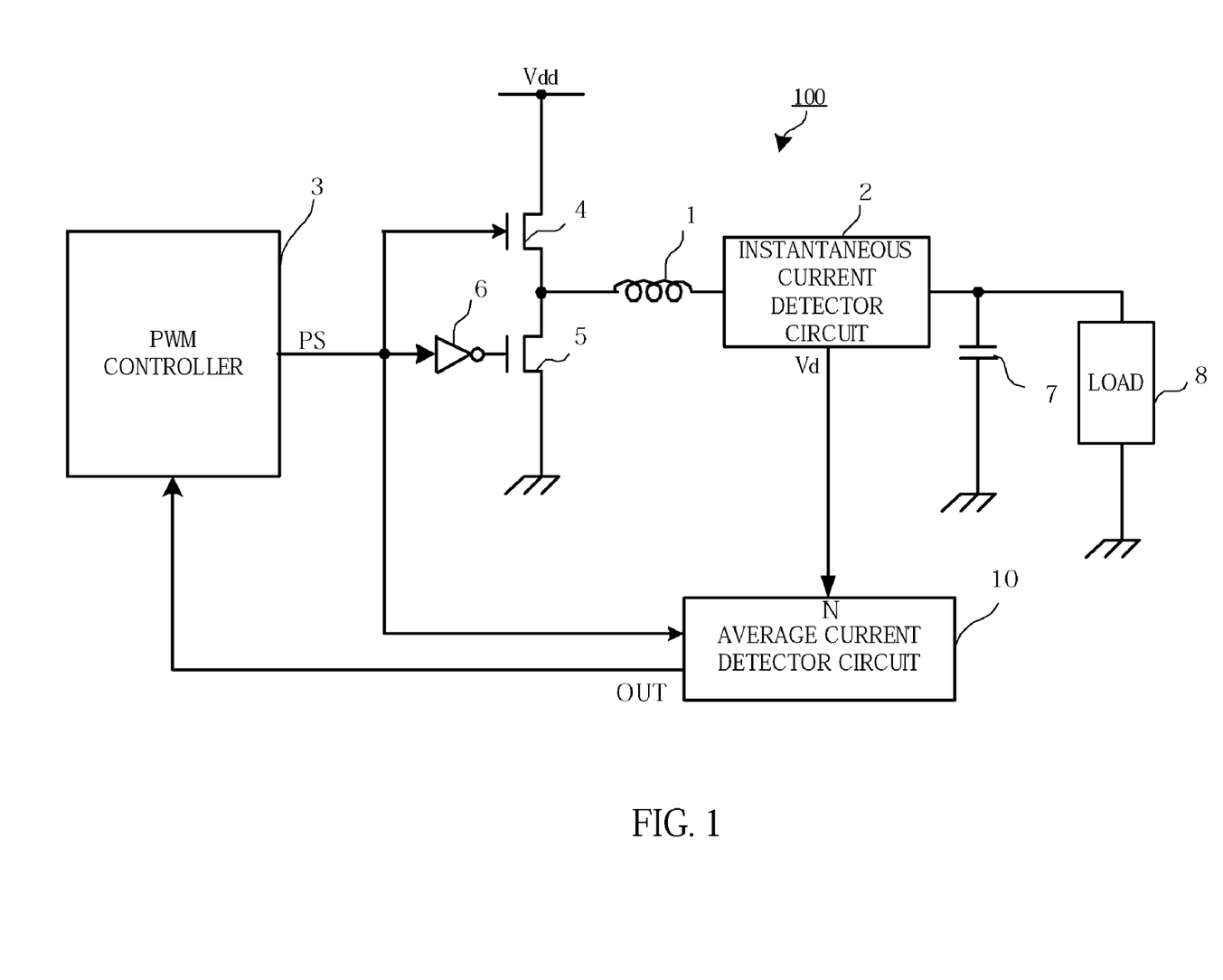
FIG. 1 is a circuit diagram showing a switching power supply device having an average current detector circuit according to an embodiment of the present invention.

An average current detector circuit 10 according to the present embodiment is used in a switching power supply device 100 shown in FIG. 1, and obtains the average value (or a voltage corresponding thereto) of a current flowing through a coil 1 during a period in which a switching transistor 4 is ON.

The switching power supply device 100 comprises a instantaneous value detector circuit 2, a PWM controller 3, and switching transistors 4 and 5 whose current paths (source-drain paths) are connected to each other in series between a power supply terminal Vdd and the ground.

The PWM controller 3 controls the duty ratio of a pulse signal PS, which is a control pulse having a predetermined cycle. The pulse signal PS is supplied to the gate of the switching transistor 4, and also to the gate of the switching transistor 5 via an inverter 6, making the switching transistors 4 and 5 be switched ON and OFF complementarily to each other.

One end of a coil (indicator) 1 is connected to the connection node between the switching transistor 4 and the switching transistor 5. When the switching transistor 4 is switched ON, a current flows from the power supply terminal Vdd to the coil 1. A smoothing capacitor 7 and a load 8 are connected in parallel to the other end of the coil 1 via the instantaneous value detector circuit 2. The instantaneous value detector circuit 2 generates a detection voltage (detection signal) Vd corresponding to an instantaneous value of the current flowing through the coil 1, and supplies the generated detection voltage Vd to the input terminal IN of the average current detector circuit 10. The instantaneous value detector circuit 2 comprises, for example, a transformer (a current transformer), a current/voltage converter, etc.

Figure 2:
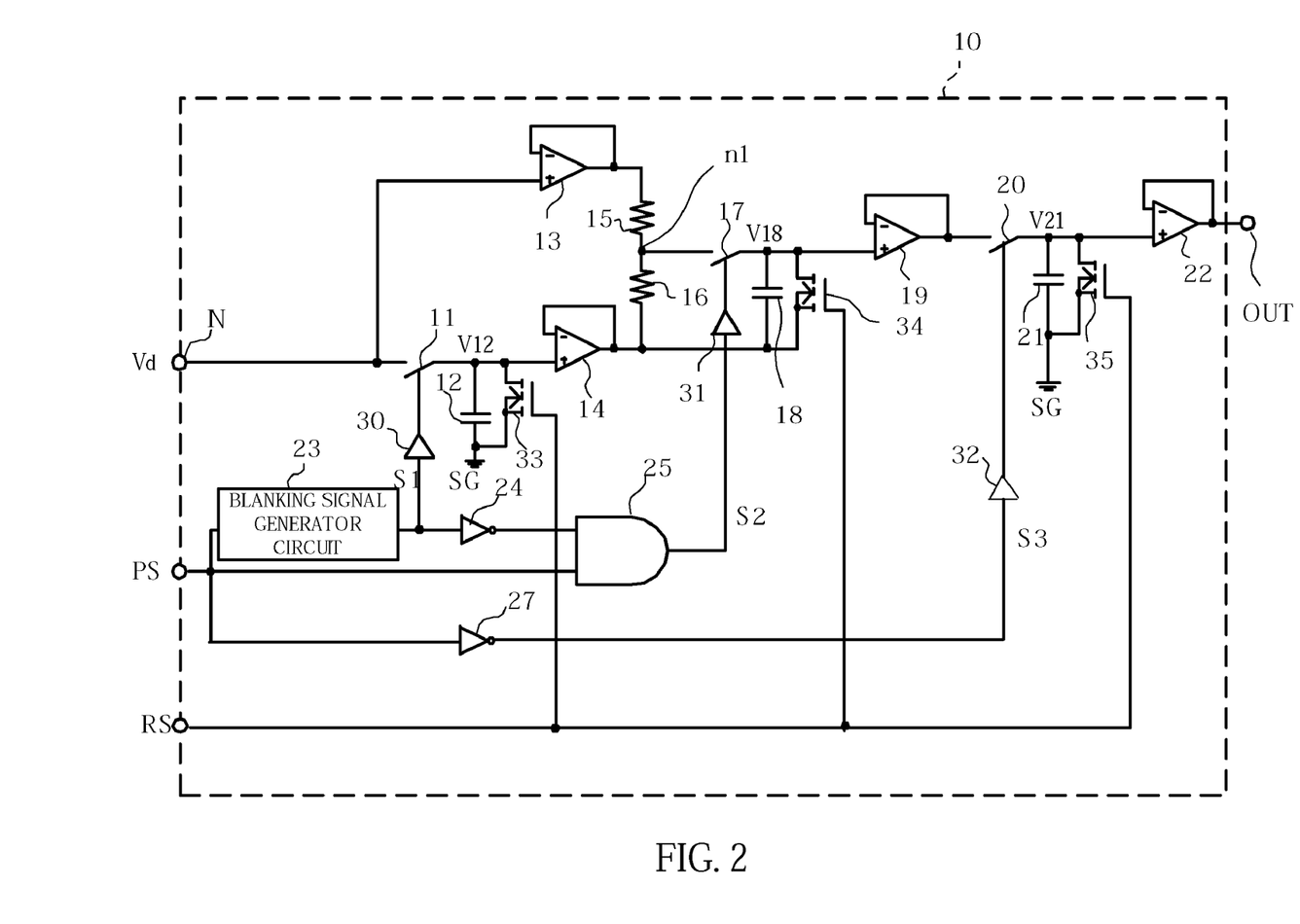
FIG. 2 is a circuit diagram showing a principal part of the average current detector circuit.

The average current detector circuit 10 obtains the average value of the current flowing through the coil 1 based on the detection voltage Vd supplied from the instantaneous value detector circuit 2. The structure of the average current detector circuit 10 will be explained with reference to FIG. 2. First, the input terminal IN of the average current detector circuit 10 is connected to one electrode of a first capacitor 12 via a first switch 11, as shown in FIG. 2. The input terminal IN of the average current detector circuit 10 is also connected to the positive phase input terminal (+) of an operating amplifier 13. The other electrode of the first capacitor 12 is connected to a signal ground SG.

The one electrode of the first capacitor 12 is also connected to the positive phase input terminal (+) of an operating amplifier 14. Resistors 15 and 16 having an equal resistance are connected in series between the output terminal of the operating amplifier 13 and the output terminal of the operating amplifier 14. The output terminal of the operating amplifier 13 is connected to the inverting input terminal (−) of the operating amplifier 13, whereby the operating amplifier 13 constitutes a voltage follower, which follows the voltage Vd input to the input terminal IN. The output terminal of the operating amplifier 14 is connected to the inverting input terminal (−) of the operating amplifier 14, whereby the operating amplifier 14 constitutes a voltage follower that follows the voltage V12 charged in the first capacitor 12.

A connection node n1 between the resistor 15 and the resistor 16 is connected to one electrode of a second capacitor 18 via a second switch 17. The other electrode of the second capacitor 18 is connected to the output terminal of the operating amplifier 14. The second capacitor 18 holds (maintains) a voltage V18, which is ½ of a difference voltage between an output voltage from the operating amplifier 13 and an output voltage from the operating amplifier 14.

The positive phase input terminal (+) of an operating amplifier 19 is connected to the one electrode of the second capacitor 18. The output terminal of the operating amplifier 19 is connected to the inverting input terminal (−) of the operating amplifier 19. The operating amplifier 19 constitutes a voltage follower that follows a voltage obtained by adding the output voltage from the operating amplifier 14 to the voltage V18 held in the second capacitor 18. The output terminal of the operating amplifier 19 is connected to one electrode of a third capacitor 21 via a third switch 20. The other electrode of the third capacitor 21 is connected to a signal ground SG.

The positive phase input terminal (+) of an operating amplifier 22 is connected to the one electrode of the third capacitor 21. The inverting input terminal (−) of the operating amplifier 22 is connected to the output terminal of the operating amplifier 22. The operating amplifier 22 constitutes a voltage follower that follows the voltage V21 held in the third capacitor 21. The output terminal of the operating amplifier 22 is connected to an output terminal OUT.

The average current detector circuit 10 further comprises a blanking signal generator circuit 23, an inverter 24, an AND circuit 25, and an inverter 27. The blanking signal generator circuit 23 generates a pulse having a predetermined pulse width and synchronous with a rise of the pulse signal PS, based on the pulse signal PS input thereto. The inverter 24 inverts the logical level of the signal generated by the blanking signal generator circuit 23. The AND circuit 25 calculates the logical sum (AND) of the output signal from the inverter 24 and the pulse signal PS. The inverter 27 inverts the logical level of the pulse signal PS.

A signal S1 output from the blanking signal generator circuit 23 is supplied to the first switch 11 via a driver 30. The signal S1 sets the first switch 11 to be ON or OFF. A signal S2 output from the AND circuit 25 is supplied to the second switch 17 via a driver 31. The signal S2 sets the second switch 17 to be ON or OFF.

A signal S3 output from the inverter 27 is supplied to the third switch 20 via a driver 32. The signal S3 sets the third switch 20 to be ON or OFF.

A reset signal RS is a signal that resets the first, second, and third capacitors 12, 18 and 21 by discharging the charge stored in the capacitors 12, 18 and 21. The reset signal RS is input commonly to the gate of N channel MOS transistors 33, 34, and 35. The drain and source of the respective N channel MOS transistors 33, 34, and 35 are connected between both the electrodes of the first, second, and third capacitors 12, 18, and 21, respectively. The PWM controller 3 detects the pulse signal PS and determines whether the output pulse is adequate or not. When the PWM controller 3 detects that it fails to output adequate pulse signal PS, it also outputs the reset signal RS.

The operation of the switching power supply device 100 will be described with reference to FIGS. 3A to 3J.

Figure 3A:
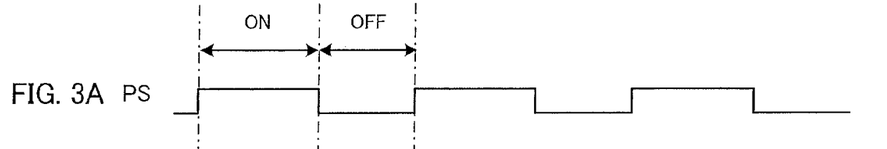
FIGS. 3A to 3J are diagrams showing the waveforms at the respective components of the average current detector circuit.

The PWM controller 3 of the switching power supply device 100 generates a pulse signal PS having a waveform shown in FIG. 3A. This pulse signal PS is input to the gate of the switching transistor 4, and also to the gate of the switching transistor 5 via the inverter 6. The switching transistors 4 and 5 are switched ON and OFF complementarily to each other based on the pulse signal PS.

By the switching transistor 4 being switched ON, a current from the power supply terminal Vdd flows through the coil 1 into the smoothing capacitor 7, charging the capacitor 7. The voltage charged in the smoothing capacitor 7 is applied to the load 8. The instantaneous value detector circuit 2 applies a detection voltage Vd corresponding to the current flowing through the coil 1 to the input terminal IN of the average current detector circuit 10.

Figure 3B:
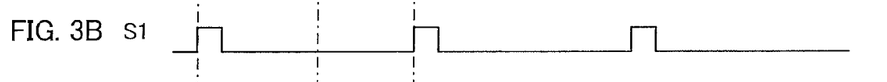
Figure 3C:
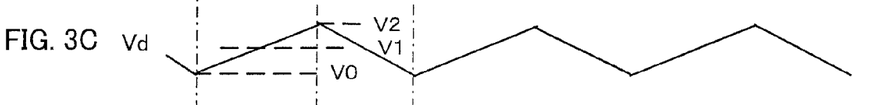

The current flowing through the coil 1 increases over time during an ON period of the switching transistor 4, while decreasing over time during an OFF period of the switching transistor 4. As shown in FIG. 3C, the detection voltage Vd supplied to the input terminal IN changes in a similar manner.

The pulse signal PS is also input to the average current detector circuit 10. The blanking signal generator circuit 23 generates a signal S1 that rises in synchronization with the rise of the pulse signal PS and has a predetermined pulse width, as shown in FIG. 3B. The period in which the signal S1 is at a high level is a sampling period. During the sampling period, the first switch 11 is switched ON and the first capacitor 12 is connected to the input terminal IN and samples the detection voltage Vd shown in FIG. 3E. The first capacitor 12 holds the sampled voltage V12 when the signal S1 is turned off.

The blanking signal generator circuit 23 is for controlling the first capacitor 12 to sample and hold the detection voltage Vd which has entered a state of including no ripples, which state appears when a predetermined time has passed after the pulse signal PS rises. Hence, the pulse width of the signal S1 may arbitrarily be set in accordance with the amount of ripple components.

Figure 3D:
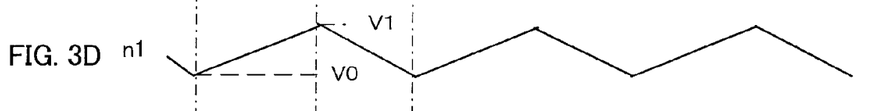
Figure 3E:
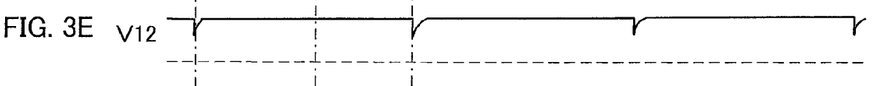
Figure 3F:
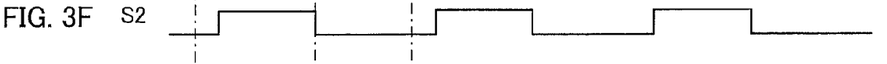

On the other hand, the signal S2 output from the AND circuit 25 rises in synchronization with a fall of the signal S1, and falls in synchronization with a fall of the pulse signal PS, as shown in FIG. 3F. The second switch 17 supplied with the signal S2 connects the second capacitor 18 to the connection node n1 when the signal S2 is at a high level.

As shown in FIG. 3C, the voltage Vd at the input terminal IN increases from an initial-value voltage V0 to a maximum-value voltage V2 during a period in which the pulse signal PS is at a high level. As shown in FIG. 3D, at the time of this increase, the voltage at the connection node n1 between the resistors 15 and 16 is $$(V2+V0)/2(=V1).$$

Figure 3G:
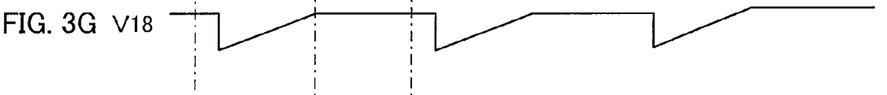

While the second capacitor 18 is connected to the connection node n1, the second capacitor 18, as shown in FIG. 3G, is charged with a voltage V18 represented by (V2+V0)/2−V0, and the second capacitor 18 holds this voltage V18.

The voltage between signal ground SG and the one electrode of the second capacitor 18 that is connected to the positive phase input terminal (+) of the operating amplifier 19 is the result of adding the voltage V18 held in the second capacitor 18 to the output voltage (=V12) from the operating amplifier 14, which result is represented by (V2+V0)/2.

This voltage can be regarded as the average value of the voltage that corresponds to the current flowing through the coil 1 and input to the input terminal IN.

Figure 3H:
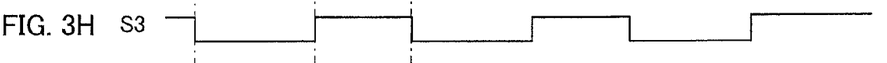

As shown in FIG. 3H, the signal S3 output from the inverter 27 is a signal obtained by inverting the logic of the pulse signal PS. The signal S3 rises in synchronization with a fall of the pulse signal PS, and falls in synchronization with a rise of the pulse signal PS. Accordingly, the third switch 20 is switched ON at the timing the second switch 17 is switched OFF and connects the third capacitor 21 to the output terminal of the operating amplifier 19. Then, the third switch 20 is switched OFF at the timing the first switch 11 is switched ON and disconnects the third capacitor 21 from the output terminal of the operating amplifier 19.

Figure 3I:
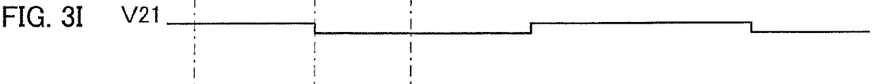

While connected to the output terminal of the operating amplifier 19, the third capacitor 21 is charged with a voltage V21 of (V2+V0)/2 and holds (maintains) this voltage as shown in FIG. 3I. That is, the third capacitor 21 is connected to the output terminal of the operating amplifier 19 during a period in which the operating amplifier 19 is outputting a voltage corresponding to the average current flowing through the coil 1. During a period other than this period, the third capacitor 21 is disconnected from the output terminal of the operating amplifier 19.

Figure 3J:
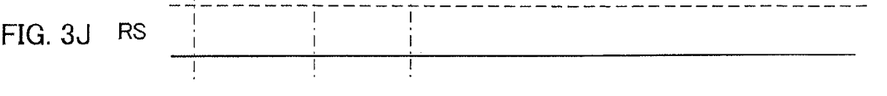

During the above operation, the reset signal RS is maintained at a low (inactive) level as shown in FIG. 3J.

During the period in which the third capacitor 21 is disconnected from the output terminal of the operating amplifier 19, the voltage V21 charged in the third capacitor 21 is output from the output terminal OUT via the operating amplifier 22, as a voltage corresponding to the average current flowing through the coil 1.

A situation can be considered that the pulse signal PS fails to pulsate. The operation of the switching power supply device 100 in the such situation will be described with reference to FIGS. 4A to 4J.

Figure 4A:
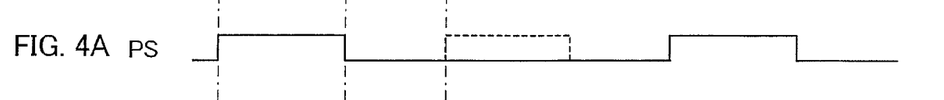
FIGS. 4A to 4J are diagrams showing the waveforms at the respective components of the average current detector circuit.
Figure 4B:
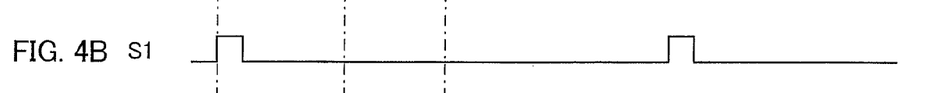
Figure 4C:
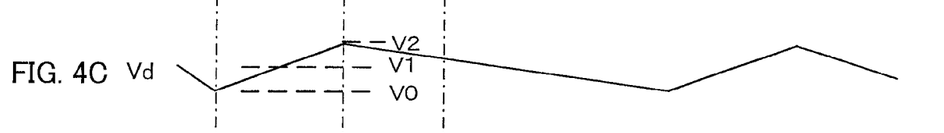
Figure 4D:
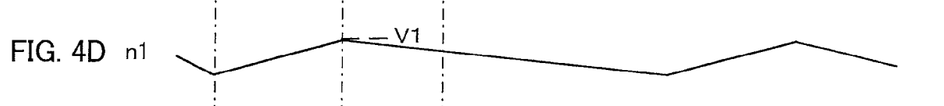
Figure 4E:
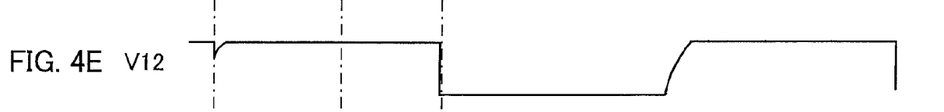
Figure 4F:
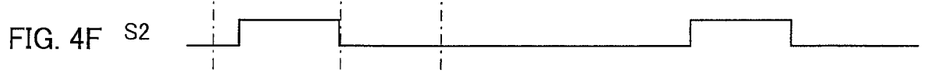
Figures 4G, 4H:
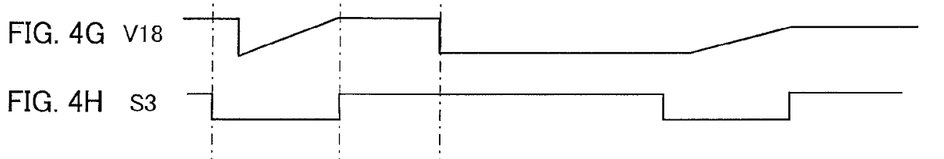
Figure 4I:
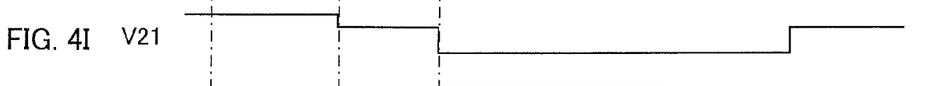
Figure 4J:
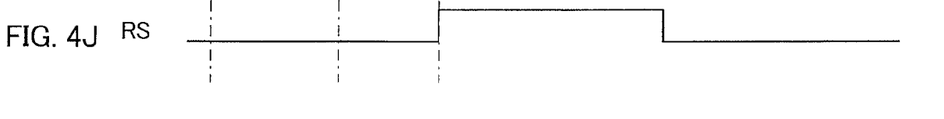

In a case where such a failure is detected in the pulse signal PS as indicated by a broken line in FIG. 4A, the reset signal RS from, for example, the PWM controller 3 input to a reset terminal of the average current detector circuit 10 rises to a high level as shown in FIG. 4J. During the period in which the reset signal RS is at a high level, the N channel MOS transistors 33, 34, and 35 are turned ON to reset the first, second, and third capacitors 12, 18, and 21 by discharging the charged held therein. That is, the voltages V12, V18, and V21 held by the respective capacitors 12, 18 and 21 becomes zero as shown in FIG. 4E, FIG. 4G, and FIG. 4I. Accordingly, when the control pulse causes a failure of pulsation and no current therefore flows to the coil 1, the voltage to be output from the output terminal OUT becomes zero. During these operations, the signal S1, the detection voltage Vd, the voltage at the node n1, the signal S2, and the signal S3 change as shown in FIGS. 4B, 4C, 4D, 4F and 4H.

As described above, the average current detector circuit 10 according to the present embodiment can easily and appropriately obtain the voltage that corresponds to the average value of the current flowing through the coil 1.

The present invention is not limited to the above-described embodiment, but can be modified in various manners.

For example, according to the above-described embodiment, the average value of the current flowing through the coil 1 of the switching power supply device 100 is obtained. However, this technique can be applied to other devices. For example, in controlling the switching of a current that flows to a magnetizing coil of a direct-current motor, etc., it is possible to easily and appropriately obtain a voltage corresponding to the average value of the current flowing through the magnetizing coil if the average current detector circuit 10 according to the present embodiment is incorporated in the direct-current motor, etc.

Further, the structural components of the average current detector circuit 10 may be replaced with other components than those used in the above-described embodiment. For example, the resistors 15 and 16, which divide the voltage at the input terminal IN, may be constituted by capacitors.

Figure 5:
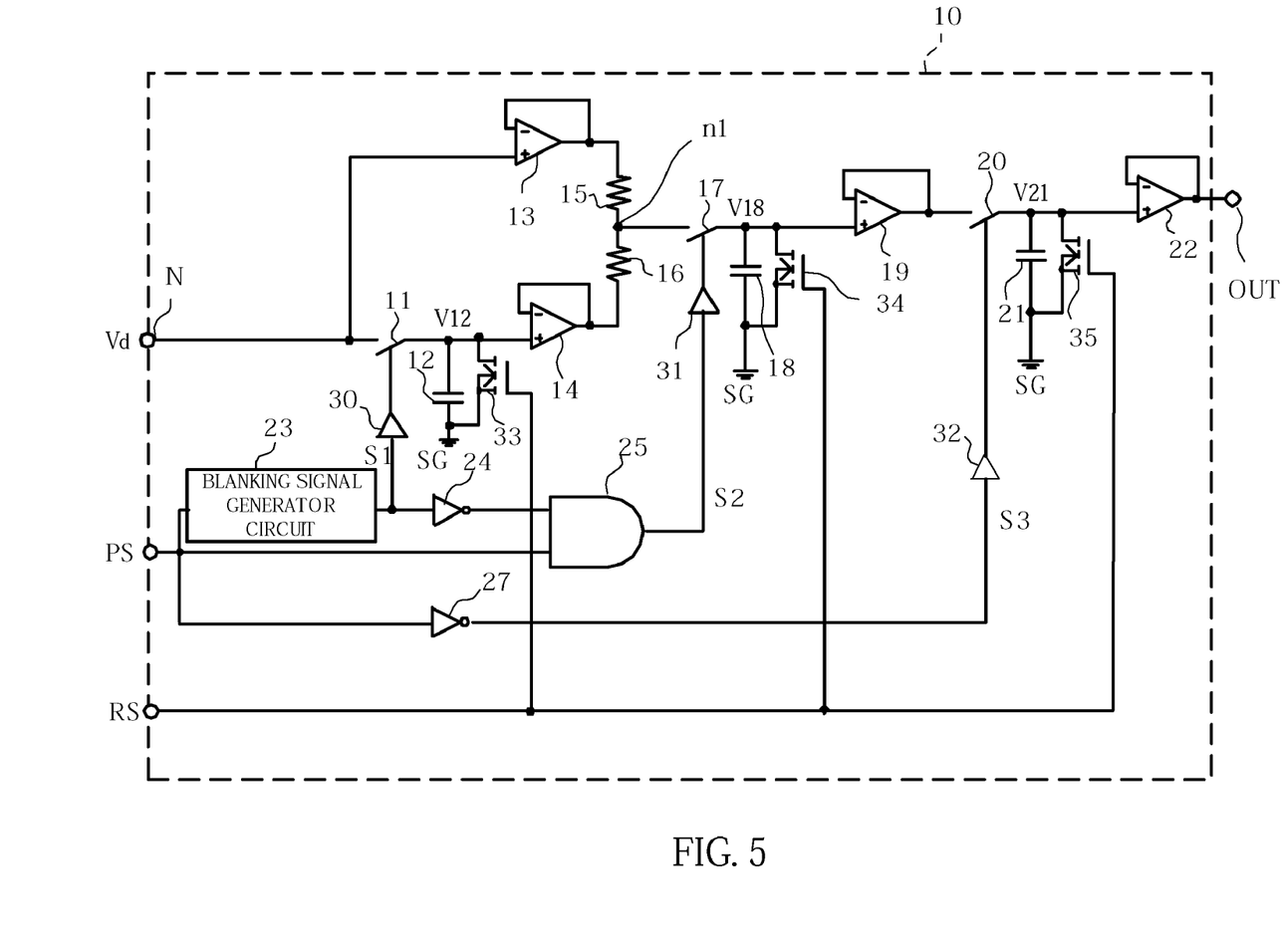
FIG. 5 is a circuit diagram showing a modified example of the average current detector circuit.

Furthermore, though having explained that the other terminal of the second capacitor 18 is connected to the output terminal of the operating amplifier 14 to have the second capacitor 18 hold a voltage of (V2+V0)/2−V0, the other terminal of the second capacitor 18 may be connected to a signal ground SG as shown in FIG. 5. With this structure, a voltage of (V2+V0)/2 is held in the second capacitor 18.

Other than the above, the circuit structure may arbitrarily be modified as long as the same functions can be realized.

Various embodiments and changes may be made thereunto without departing from the broad spirit and scope of the invention. The above-described embodiment is intended to illustrate the present invention, not to limit the scope of the present invention. The scope of the present invention is shown by the attached claims rather than the embodiment. Various modifications made within the meaning of an equivalent of the claims of the invention and within the claims are to be regarded to be in the scope of the present invention.

This application is based on Japanese Patent Application No. 2005-215662 filed on Jul. 26, 2005 and including its specification, claims, drawings and summary. The disclosure of the above Japanese Patent Application is incorporated herein by reference in its entirety.

What is claimed is:

1. An average current detector circuit for outputting a voltage corresponding to an average value of a current flowing through a coil during a period in which a pulse, which repetitively becomes ON and OFF, is being ON, said circuit comprising:

a voltage circuit which outputs a voltage corresponding to an instantaneous value of the current flowing through said coil;

a first sample/hold circuit which holds the voltage from said voltage circuit, by entering a hold state from a sampling state, at a timing at which the pulse becomes ON;

a first dividing circuit which outputs a voltage corresponding to ½ of a difference between the voltage held in said first sample/hold circuit and the voltage output from said voltage circuit; and a second sample/hold circuit which holds the voltage output from said first dividing circuit, by entering a hold state from a sampling state, at a timing at which the pulse becomes OFF, and outputs the held voltage corresponding to a sum of the held voltage in the first sample/hold circuit and the held voltage in the second sample/hold circuit as a voltage corresponding to an average value of the current flowing through said coil, during a period in which the pulse is becoming ON.

2. The average current detector circuit according to claim 1, further comprising a third sample/hold circuit which receives the output of the second sample/hold circuit, and shifts to a sampling state at a timing at which after said second sample/hold circuit shifts to a hold state, and shifts to a hold state at a timing at which said first sample/hold circuit shifts to a sampling state.

3. The average current detector circuit according to claim 1, further comprising a duty ratio control circuit which controls a duty ratio of the pulse.

4. The average current detector circuit according to claim 1, further comprising:
a reset section which makes a signal level corresponding to the average current ineffective, when a failure of pulsation of the pulse is detected.

5. An average current detector circuit for outputting a voltage corresponding to an average value of a current flowing through a coil during a period in which a pulse, which repetitively becomes ON and OFF, is being ON, said circuit comprising:
a voltage circuit which outputs a voltage corresponding to an instantaneous value of the current flowing through said coil;
a first sample/hold circuit which holds the voltage from said voltage circuit, by entering a hold state from a sampling state, at a timing at which the pulse becomes ON;
a first dividing circuit which outputs a voltage corresponding to an average voltage of the voltage held in said first sample/hold circuit and the voltage output from said voltage circuit; and
a first sample/hold circuit which holds the voltage output from said second dividing circuit, by entering a hold state from a sampling state, at a timing at which the pulse becomes OFF.

6. The average current detector circuit according to claim 5, further comprising a third sample/hold circuit which receives the output of the second sample/hold circuit, and shifts to a sampling state at a timing at which after said second sample/hold circuit shifts to a hold state, and shifts to a hold state at a timing at which said first sample/hold circuit shifts to a sampling state.

7. The average current detector circuit according to claim 5, further comprising a duty ratio control circuit which controls a duty ratio of the pulse.

8. The average current detection circuit according to claim 5, further comprising: a reset section which makes a signal level corresponding to the average current ineffective, when a failure of pulsation of the pulse is detected.

* * * * *